(12) United States Patent
Zhao et al.

(10) Patent No.: US 9,240,672 B1
(45) Date of Patent: Jan. 19, 2016

(54) WAVELENGTH TUNABLE LASER

(71) Applicant: Google Inc., Mountain View, CA (US)

(72) Inventors: Xiangjun Zhao, Fremont, CA (US);
Cedric Fung Lam, Belmont, CA (US);
Steven Fong, Sunnyvale, CA (US)

(73) Assignee: Google Inc., Mountain View, CA (US)

( * ) Notice: Subject to any disclaimer, the term of this patent is extended or adjusted under 35 U.S.C. 154(b) by 0 days.

(21) Appl. No.: 14/293,133

(22) Filed: Jun. 2, 2014

(51) Int. Cl.
*H01S 3/10* (2006.01)
*H01S 5/06* (2006.01)
*H01S 5/125* (2006.01)

(52) U.S. Cl.
CPC ............... *H01S 5/0612* (2013.01); *H01S 5/125* (2013.01)

(58) Field of Classification Search
CPC ... H01S 5/06256; H01S 5/0265; H01S 5/026; H01S 5/06258; H01S 5/12; H01S 5/4087; H01S 5/141; H01S 5/0687; H01S 3/107; H01S 5/06213; H01S 5/0683; H01S 5/042; H01S 3/042; H01S 5/02415; H01S 5/22; B82Y 20/00
USPC ................... 372/20, 45.01, 50.11, 38.02, 34, 372/29.015, 26, 29.01, 29.016, 29.023, 372/43.01, 50.01
See application file for complete search history.

(56) References Cited

U.S. PATENT DOCUMENTS

| | | | | |
|---|---|---|---|---|
| 5,325,382 | A | * | 6/1994 | Emura et al. ................. 372/26 |
| 5,642,371 | A | * | 6/1997 | Tohyama et al. .......... 372/45.01 |
| 8,615,025 | B2 | | 12/2013 | Dallesasse et al. |
| 2010/0002733 | A1 | | 1/2010 | Luo et al. |
| 2012/0236889 | A1 | * | 9/2012 | Caneau et al. ............. 372/45.01 |
| 2013/0114634 | A1 | | 5/2013 | Kuksenkov et al. |

FOREIGN PATENT DOCUMENTS

WO WO-2013070509 A1 5/2013

* cited by examiner

Primary Examiner — Jessica Stultz
Assistant Examiner — Delma R Forde
(74) Attorney, Agent, or Firm — Honigman Miller Schwartz and Cohn LLP

(57) ABSTRACT

A wavelength tunable laser includes a gain section, a grating section, and an isolation section. The gain section generates and modulates an optical signal. The grating section is positioned adjacent to the gain section, and the isolation section is disposed between the gain section and the grating section. The isolation section impedes conduction of an electrical current between the gain section and the grating section.

17 Claims, 5 Drawing Sheets

WAVELENGTH TUNABLE LASER

TECHNICAL FIELD

This disclosure relates to wavelength tunable lasers.

BACKGROUND

A basic communication system generally includes a transmitter that converts a message to an electrical form suitable to be transferred over a communication channel. The communication channel transfers the message from the transmitter to a receiver. The receiver receives the message and converts it back to its original form.

Fiber optic communication is an emerging method of transmitting information from a source (transmitter) to a destination (receiver) using optical fibers as the communication channel. Optical fibers are flexible, transparent fibers made of thin glass silica or plastic that transmits light throughout the length of the fiber between the source and the destination. Fiber optic communications allows for the transmission of data over longer distances and at higher bandwidth than other known forms of communication. Fiber optics are an improved form of communication over metal wires because the light traveled through the fiber experiences less loss and is immune to electromagnetic interference. Companies use optical fibers to transmit telephone signals, interact communication, and cable television signals.

SUMMARY

One aspect of the disclosure provides a wavelength tunable laser that includes a gain section, a grating section, and an isolation section. The gain section generates and modulates an optical signal. The grating section is positioned adjacent to the gain section, and the isolation section is disposed between the gain section and the grating section. The isolation section impedes conduction of an electrical current between the gain section and the grating section.

Implementations of the disclosure may include one or more of the following features. In some implementations, the wavelength tunable laser includes a phase-shift section disposed between the gain section and the isolation section. The phase-shill section imparts a phase-shift to the optical signal. While a tunable DBR laser can be designed with a phase shift section, which helps stabilize the output mode and maintain a narrow output line width, the laser may omit the phase-shift section for applications where the output line width is not as important, such as with direct modulation. In such cases, omitting the phase-shift section simplifies the structure of the laser.

In some implementations, the isolation section defines a trench or an oxide layer. The wavelength tunable laser may further include a thermo-electric cooler disposed on the gain section, the phase-shift section, the grating section, and the isolation section. The thermo-electric cooler regulates a temperature of the gain section to be a lasing temperature within a temperature dependent tunable wavelength range.

In some examples, the phase-shift section has a length along a direction of optical signal propagation of less than 200 micrometers. Additionally, the grating section may have a length along a direction of optical signal propagation greater than the length of the phase-shift section. The sum of the lengths of the gain section, the phase-shift section, and the length that defines the effective grating location defines the laser Fabry-Perot cavity length, which defines the spacing of the output signal modes (or wavelengths). In some implementations, the sum of those three lengths needs to match the laser output mode spacing. The gain section may output the optical signal from a gain section facet on a side opposite the phase-shift section. In some examples, the grating section includes a dielectric mirror or a Bragg reflector.

In some implementations, the wavelength tunable laser further includes a controller in communication with the gain section, the phase-shift section, and the grating section. The controller delivers a modulation current to the gain section for modulating the optical signal. In addition, the controller delivers a bias current to the grating section for setting the wavelength of the optical signal. The modulation current may be smatter than the bias current to avoid over modulating the laser and creating clipping conditions. The modulation current may be as large as possible to make use of the all the laser output power for generating pulses of 1's and 0's, while avoiding overdriving the laser. The current applied to grating section may be increased due to the addition of the trench.

Another aspect of the disclosure provides a method that includes receiving a modulation current at a gain section of a tunable laser for generating and modulating an optical signal and receiving a bias current at a grating section to set a lasing mode of the tunable laser. The method may also include receiving a bias current at the gain section. The bias current in the gain section sets the laser output power, while the bias current in the grating section sets the laser output wavelength. The method also includes impeding conduction of an electrical current between the gain section and the grating section.

In some implementations, the method includes impeding conduction of an electrical current between the grating section and a phase shift section disposed between the grating section and the gain section. The method may include defining a trench between the phase-shift section and the grating section. In sonic examples, the method includes outputting an optical signal from the gain section from a gain section facet on a side opposite the phase-shift section. Moreover, the grating section may have an optical path length greater than the length of the phase-shift section. The grating section is usually implemented as a distributed bragg reflector (DBR).

Another aspect of the disclosure provides a method of tuning a tunable laser. The method includes altering a temperature of a gain section and a grating section of the tunable laser. The tunable laser includes a phase-shift section, a grating section, and an isolation section. The phase-shift section is disposed on the gain section, and the grating section is positioned adjacent to the phase-shift section opposite the gain section. The isolation section is disposed between the phase-shift section and the grating section. The isolation section impedes the conduction coupling of an electrical current between the gain section and the grating section. In some examples, the isolation section defines a trench or comprises an oxide layer.

Altering a temperature of the gain section may include delivering a modulation current to the gain section. Altering a temperature of the grating section may include delivering a bias current to the grating section.

In some examples, altering a temperature of the gain section or the grating section includes delivering an electrical current to a thermo-electric cooler disposed on the gain section, the phase-shift section, and the isolation section. Moreover, the grating section may be implemented as a distributed Bragg reflector. The gain section may output the optical signal from a side opposite the phase-shift section.

The details of one or more implementations of the disclosure are set forth in the accompanying drawings and the

DESCRIPTION OF DRAWINGS

Like reference symbols in the various drawings indicate like elements.

DETAILED DESCRIPTION

Figure 1:
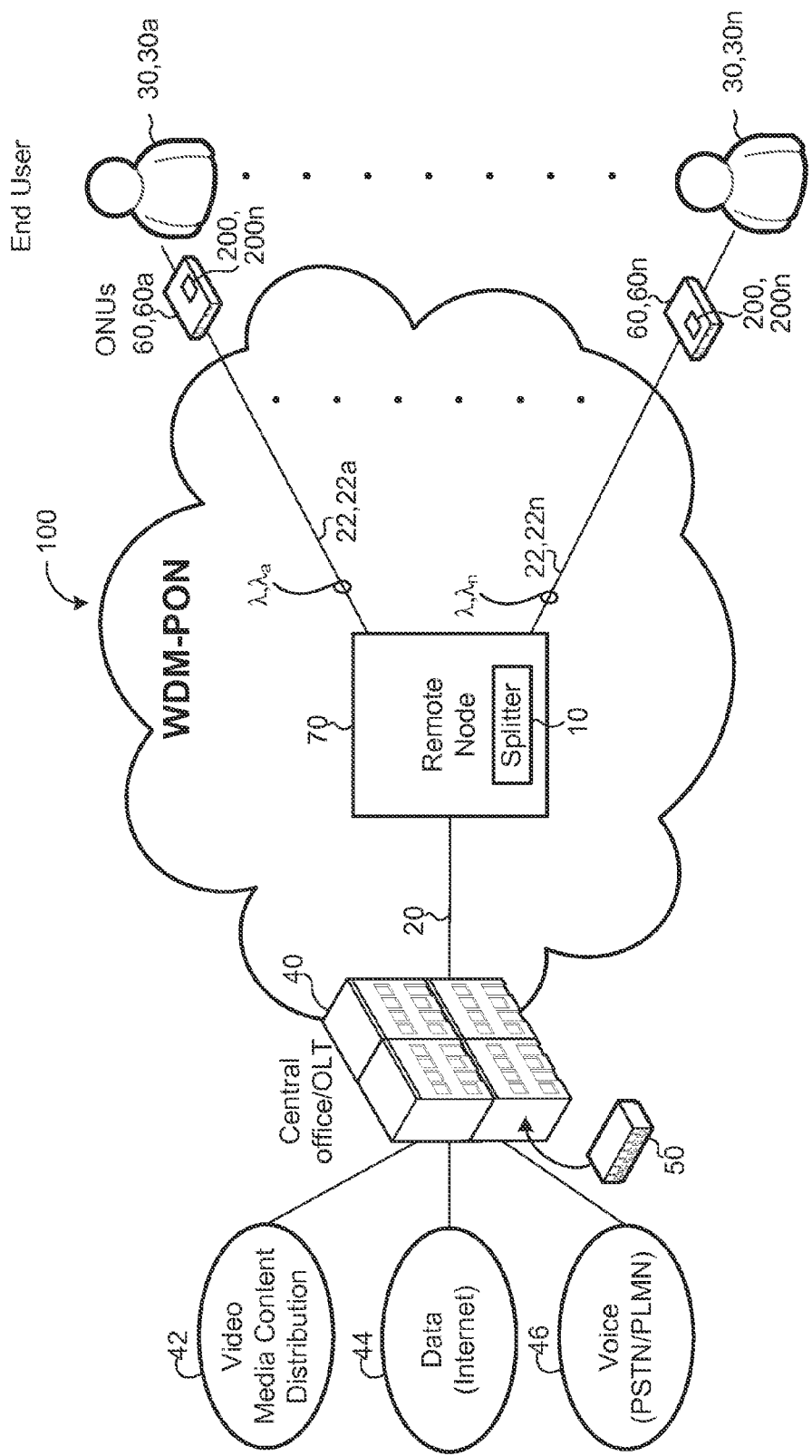
FIG. 1 is a schematic view of an exemplary passive optical network using an exemplary wavelength tunable laser

Fiber-to-the-home (FTTH) is the delivery of a communication signal through optical fibers from a central office (CO) or optical line terminal (OLT) to a home or a business of a user. Referring to FIG. 1, a passive optical network (PON) 100 is a point-to-multipoint network architecture that uses optical splitters 10 to enable a single optical fiber feeder 20 to serve multiple users 30a-30n (e.g. 16-128). The PON 100 provides optical signals from a CO 40 and includes an optical line terminal 50 (e.g., optical transmitter/receiver or transceiver) to a number of optical network units/terminals (ONUs) 60. Each ONU 60 includes an optical transmitter/receiver (i.e., transceiver) for transmitting and receiving data from the CO 40. In some examples, the PON 100 includes multiple optical transmitter/receiver or transceiver systems 50, 60. One feeder fiber 20 is sent from the CO 40 to a remote node 70, where the signal is split and distributed to many (e.g., 16, 205 or more) different ONUs 60a-60n via fiber feeders 22, 22a-22n.

In some implementations, a wave division multiplexed passive optical network (WDM-PON) 100 provides CO fiber termination consolidation, bandwidth scalability and the easy-to-understand end-to-end Ethernet transparency. WDM-PON offers every broadband subscriber 30 a separate wavelength pair for upstream and downstream transmission respectively; thus offering privacy to each user. A WDM-PON network uses a wavelength demultiplexer to distribute optical wavelengths to end-users 30 through an access fiber 22. Optical beams having different wavelengths $\lambda$ propagate without interfering with one another. This allows for several channels of information where each has a different wavelength $\lambda$ to be transmitted simultaneously over a single optical fiber 20. Therefore, the capacity of a WDM-PON network is limited by the number of wavelengths $\lambda$ available in a WDM-PON network 100. In addition, each wavelength $\lambda$ in a WDM-PON network 100 may run at a different speed; therefore, the speed of each individual user 30 may be individually upgraded to a faster speed without updating the speed of other users 30.

The OLT 50 is the endpoint of the PON 100 and terminates the user signals and provide the uplink connection to the carrier network. In a conventional TDM PON, OLT 50 coordinates multiplexing between the ONUs at the user end 30. The OLT 50 sends the fiber optic signal through a feeder fiber 20, and the signal is received by a remote node 70, which demultiplexes the signal and distributes it to multiple users 30.

A multiplexer (MUX) combines several input signals and outputs a combined signal of the individual inputs. The multiplexed signal is transmitted through a physical wire, e.g., single optical fiber 20, which saves the cost of having multiple wires for each signal. As shown in FIG. 1, the CO 40 crossconnects the signals received from several sources, such as video media distribution 42, internet data 44, and voice data 46, and multiplexes the received signals into one multiplexed signal before sending the multiplexed signal to the remote node 70 through the feeder fiber 20. The CO 40 includes a carrier source (e.g., a laser diode or a light emitting diode) for generating an optical signal that carries the multiplexed signal to the end user 30. On the receiver end, a reverse process occurs using a demultiplexer (DEMUX). The demultiplexer receives the multiplexed signal and divides it into the separate original signals that were originally combined. In some examples, a photodetector converts the optical wave back into its electric form and is located at both the OLT and ONU.

An ONU 60, on the user 30 end, includes a tunable laser 200 for generating an optical signal that carries the information to be sent from an end user 30 to the CO 40. A tunable laser 200 is a high-frequency generator or oscillator, which requires amplification, feedback, and a tuning mechanism that determines the frequency. Lasers emit light coherently such that the laser output is a narrow beam of light. In some implementations, a laser includes a medium that provides the amplification and the frequency, and mirrors that provide the feedback. Photons bounce off one mirror through the medium and head back to another mirror to bounce back for further amplification. One, and sometimes both mirrors, may partially transmit light to allow a fraction of the generated light to be emitted. A laser diode is an electrically pumped semiconductor laser having an active medium being a p-n junction. The p-n junction is created by doping (i.e., introduction of impurities into a pure semiconductor to change its electrical properties).

In a WDM-PON network 100, each user 30 is allocated a different wavelength $\lambda$ for upstreaming data to the CO 40. Therefore, each ONU 60 uses a wavelength-agile transmitter, such as a tunable wavelength laser 200, to transmit data to the CO 40 at different wavelengths $\lambda$. The tunable wavelength laser 200 may be tuned at the time of provisioning each user 30. It simplifies the operation by allowing the use of a single type of transceiver by all users 30.

Figure 2A:
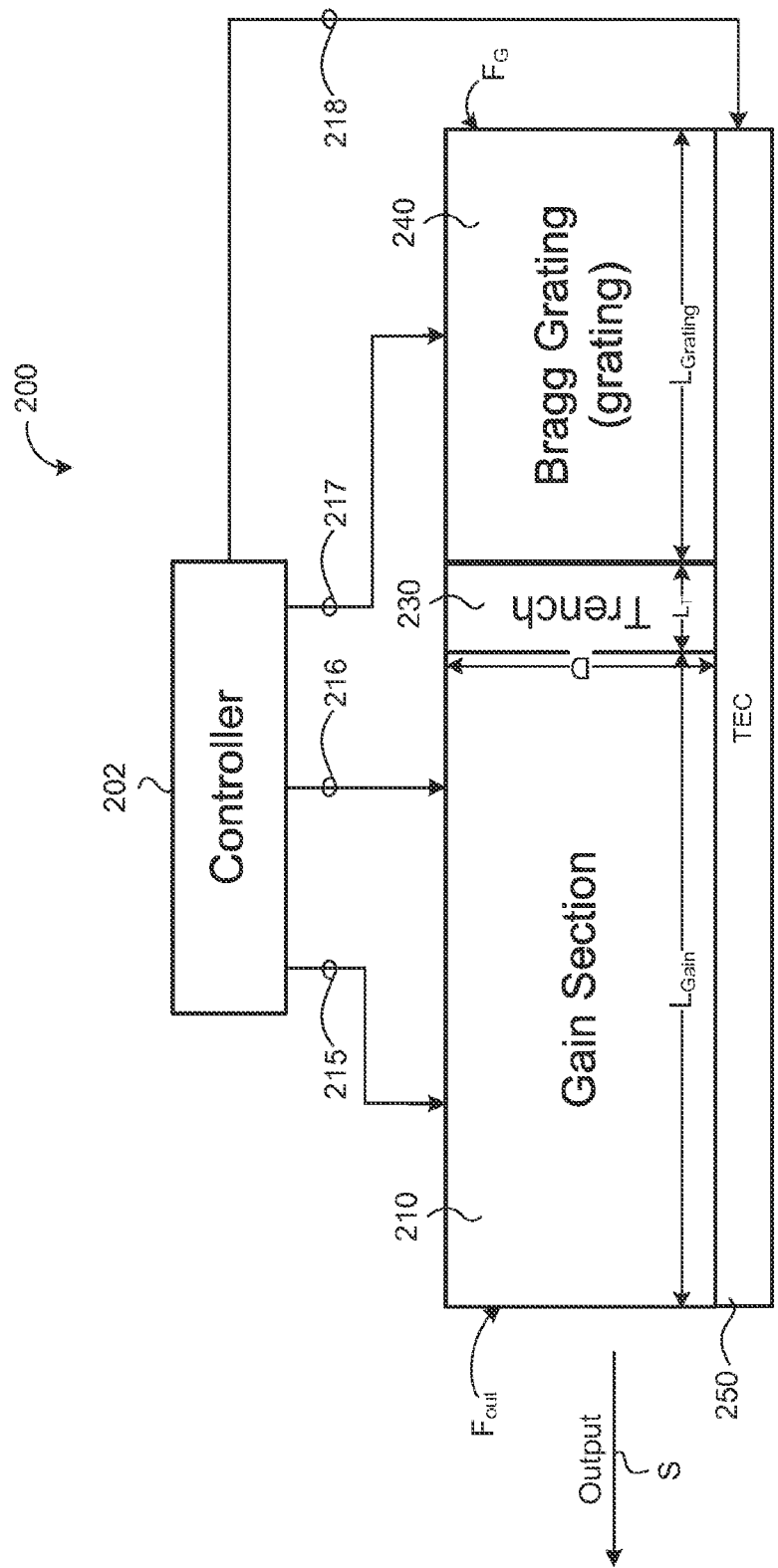
FIG. 2A is a schematic view of an exemplary wavelength tunable laser.
Figure 2B:
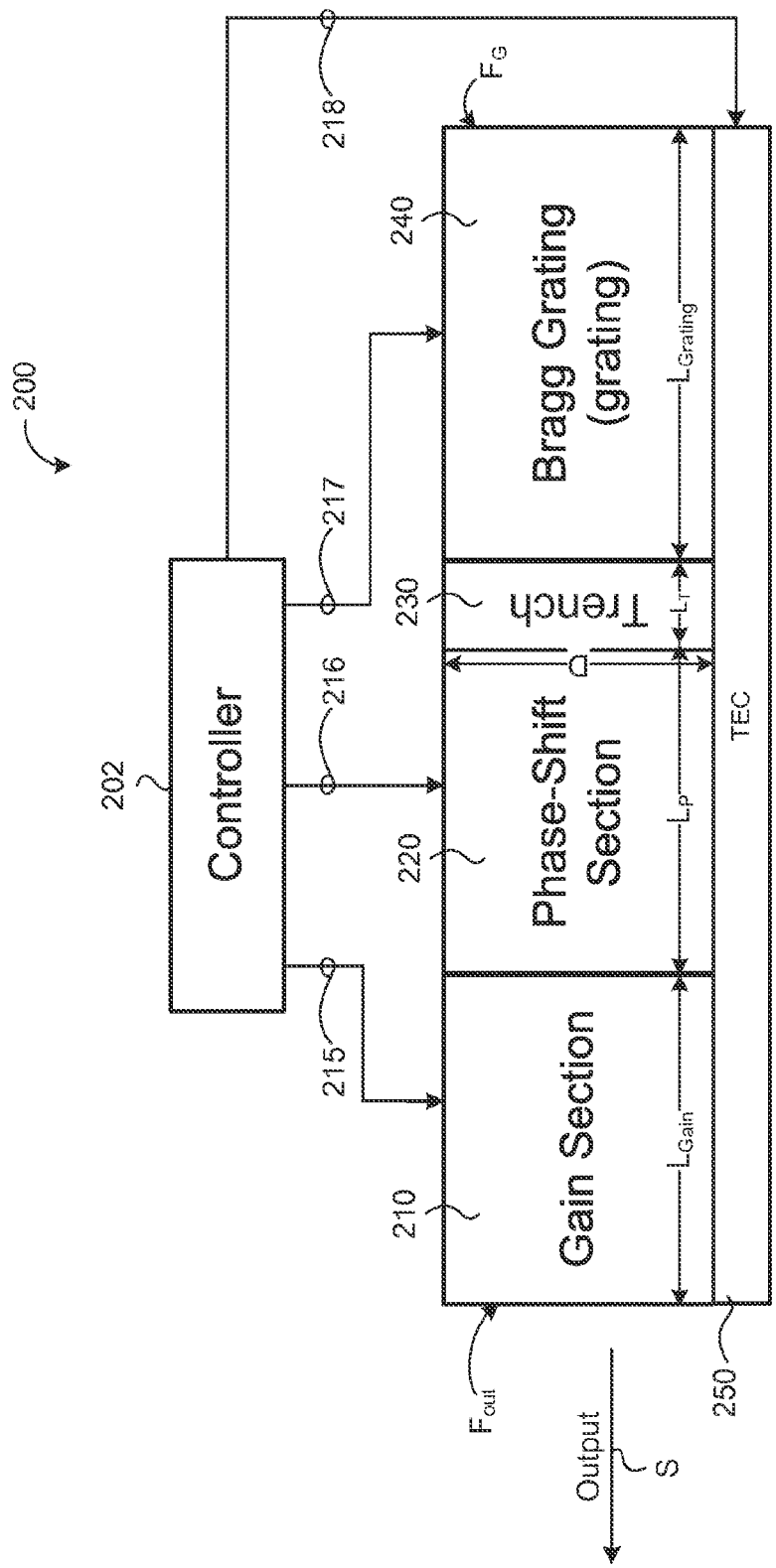
FIG. 2B is a schematic view of another exemplary wavelength tunable laser.

Referring to FIGS. 2A and 2B, tunable lasers 200 operate at different wavelengths $\lambda$ changed in a controlled manner (e.g., using a controller 202), as by temperature and/or a control current. The tunable laser 200 is mounted on a thermo-electric cooler (TEC) 250 and supplied with a driving current 216. The wavelength tunable laser 200 includes a gain section 210, a grating section 240 for tuning the optical signal (e.g., Distributed Bragg Reflector (DBR)), and optionally a phase-shift section 220.

The gain section 210 generates and modulates an optical signal. In order to generate and modulate an optical signal S, the gain section 210 must be in a non-thermal energy distribution state known as population inversion state. Population inversion occurs when a greater number of atoms or molecules within a system are in the excited state than in lower energy states. The preparation of the population inversion state requires an external energy source known as laser pumping to be applied to the system. Laser pumping occurs when an external source of energy is transferred to the gain section 210 of a tunable laser 200. The energy is absorbed by the gain section 210, resulting in an excited state of the molecules of the gain section 210 to achieve a population inversion state. The pump energy is usually in the form of light or an electric current 216 applied to the gain section 210. Other examples of pump energy may be used, such as chemical or nuclear reactions.

The phase-shift section 220 is disposed on the gain section 210, and imparts a phase shift to the optical signal S. The phase shift is the change that occurs in the phase of one quantity, or in the phase difference between two or more quantities. A change in phase of the optical S does not include a change in the frequency of the optical signal S. In some examples, the phase-shift section 220 has a length $L_P$ along a direction of optical signal propagation S of less than 200 micrometers. For a directly modulated tunable DBR, the phase-shift section 220 may be omitted because the phase will not be well defined when the laser gain is directly modulated. While a tunable DBR laser 200 can be designed with a phase shift section 220, which helps stabilize the output mode and maintain a narrow output line width, the laser 200 may omit the phase-shift section 200 for applications where the output line width is not as important, such as with direct modulation. In such cases, omitting the phase-shift section 220 simplifies the structure of the laser 200.

In laser implementations without the phase-shift section 220, the grating section 240 is positioned adjacent to the gain section 210. In laser implementations with the phase-shift section 220, the grating section 240 is positioned adjacent to the phase shift section 220 and opposite the gain section 210. The grating section 240 includes a periodic structure, which reflects light of particular wavelengths. The grating section 240 is a reflecting structure that has aperiodic refractive index modulation. In some examples, the grating section 240 is a dielectric mirror, also known as a Bragg mirror, also known as a distributed Bragg reflector (DBR). The DBR is a structure formed from multiple layers having different materials where each has a different refractive index, or by periodic variation of some characteristic (e.g., such as height) of a dielectric waveguide, resulting in periodic variation in the effective refractive index in the guide. Each layer of the DBR partially reflects an optical signal passing through the DBR. Therefore, the grating section 240 disperses the optical signal S into wavelength components having corresponding diffraction peaks. While an external modulator (e.g., an EA (electro-optic modulator) or an SOA (semiconductor optical amplifier) modulator) may modulate the wavelength $\lambda$ of the optical signal S before the modulated optical signal S is transmitted through high speed fiber optics 20, 22, the wavelength tunable laser 200, as shown, eliminates the need to use the external modulator, and instead directly modulates the gain section 210 (unlike the conventional DBR transmitters that use an external modulator). Eliminating the use of an external modulator reduces the cost of the tunable laser 200 due the reduction of one component, i.e., the external modulator. Moreover, eliminating the external modulator reduces the absorption of light as it travels from the gain section 210 to the output of the tunable laser 200, because the light travels through one less section (i.e. the external modulator) of the tunable laser 200. Therefore, more optical light S is outputted from the tunable laser 200, because less light is absorbed by sections of the tunable laser 200.

The output wavelength of the tunable laser 200 is controlled by the feedback wavelength of the grating section 240, which is controlled by the grating bias current 217. Since the modulation of the bias current 215 of the gain section 210 is coupled to the grating section 240 through crosstalk between the gain bias current 215 and the grating bias current 217, fluctuation in the output wavelength may occur, which is highly undesirable. Crosstalk is the phenomenon where one signal transmitted in a first medium of a transmission system creates an undesired effect in a different medium. In this case, the electrical current 215 applied to the gain section 210 is coupled into the grating section 240 due to the leakage between the gain section and the grating section. When the gain current 215 is modulated, the fluctuation is imposed on the grating section as well, causing the laser output wavelength to broaden. Therefore, an isolation trench 230 may be positioned between the gain section 210 and the grating section 240 to reduce the leakage from the gain section 210 to the grating section 240. The isolation layer 230 (trench or oxide layer) is added to the tunable wavelength laser 200 to impede conduction of an electrical current 215 between the gain section 210 and the grating section 240. In implementations with the phase-shift section 220, the isolation layer 230 is disposed between the phase shift section 220 and the grating section 240. The isolation layer 230 may be implemented as a trench, such as a depression between the phase shift section 220 and the grading section 240, having a depth D greater than the length $L_T$. In some examples, the isolation section 230 includes an oxide layer with high impedance.

Without the isolation layer, the modulation signal applied to the gain section must be very small so that the crosstalk from the gain section to the grating section is small and the change in output optical wavelength is therefore small. This is however, undesirable because most of the optical power is just DC signal without carrying useful information and the resultant signal to noise ratio (SNR) will be poor.

The grating length $L_{grating}$ may be increased from that used with an external modulation, and the current 217 injected to the grating section 240 may also be increased. If there is cross talk between the modulation current 215 (applied to the gain section 210) and the grating current 217 (applied to the grating section 240), increasing the grating current 217 decreases the effect of the crosstalk (the effect of crosstalk is less felt by the tunable laser 200, which stabilizes the wavelength of the output optical signal S). Lastly, increasing the grating length $L_{grating}$ provides stronger reflectivity (the coupling back into the gain section 210), which improves the power of the output signal S.

The tunable laser 200 may be mounted on a thermo-electric cooler (TEC) 250 and supplied with a driving current 218. The TEC 250 temperature may be a predetermined temperature to determine the gain and output wavelength of the tunable laser 200. A controller 202 controls the driving current 218, which determines the temperature of the TEC 250 and therefore the gain of the tunable laser 200. A temperature of the TEC 250 may be adjusted to set the gain of the tunable laser 200. In some examples, the controller 202 delivers a control current 216 to the TEC 250 to set the temperature of the TEC 250 and therefore the gain and output wavelength of the tunable laser 200.

The tunable laser 200 usually outputs light from a facet of the grating section $F_G$. Since the controller 202 may deliver a grating current 217 injected into the grating section 240, some of the light is absorbed in the grating section 240 through a free carrier absorption effect, which reduces the output power level of the optical signal S. Therefore, outputting the output signal S from a facet $F_{out}$ of the gain section 210 increases the output power and reduces the output power dependence on optical output wavelength.

The tunable wavelength laser 200 is capable of transmitting an optical signal at different wavelengths $\lambda$ at the ONU 60, which provides for a colorless (i.e., wavelength-independent) ONU 60. Colorless ONUs 60 is a category of ONUs whose output wavelength can be flexibly changed as needed. As such, identical ONUs 60 can be deployed across the network 100.

Figure 3:
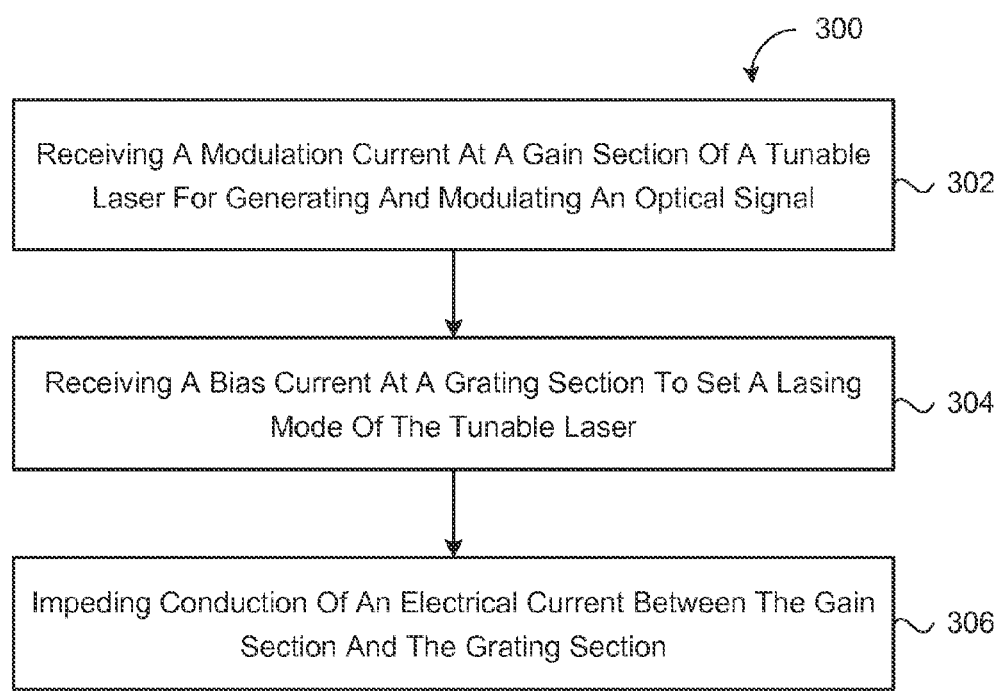
FIG. 3 is a schematic view of an exemplary arrangement of operations for operating a wavelength tunable laser.

FIG. 3 provides an exemplary arrangement of operation for a method 300 of operating a tunable laser 200. Other arrangements are possible as well, because the steps can be performed in any order or even simultaneously. The method 300 includes receiving 302 a modulation current 215 at a gain section 210 of a tunable laser 200 for generating and modulating an optical signal S and receiving 304 a bias current 217 at a grating section 240 to set a lasing mode of the tunable laser 200. The method may also include receiving a bias current 216 at the gain section 210. The bias current 216 in the gain section 210 sets the laser output power, while the bias current 217 in the grating section 240 sets the laser output wavelength λ. The method also includes impeding 306 conduction of an electrical current 215, 217 between the gain section 210 and the grating section 240.

In some implementations, the method includes impeding conduction of an electrical current 215, 217 between the grating section 240 and a phase shift section 220 disposed between the grating section 240 and the gain section 210. The method may include defining a trench 230 between the phase-shift section 230 and the grating section 240. In some examples, the method includes outputting an optical signal S from the gain section 210 from a side $F_{out}$ opposite the phase-shift section 220.

Figure 4:
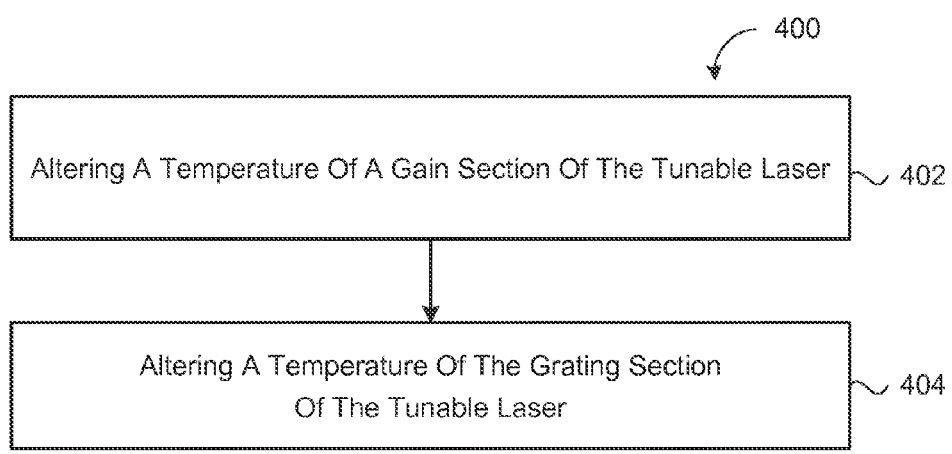
FIG. 4 is a schematic view of an exemplary arrangement of operations for using a wavelength tunable laser.

FIG. 4 provides an exemplary arrangement of operation for a method 400 of using a tunable laser 200. Other arrangements are possible as well, because the steps can be performed in any order or even simultaneously. The method 400 includes altering 402 a temperature of a gain section 210 of the tunable laser 200. The tunable laser 200 includes a phase-shift section 220, a grating section 240, and an isolation section 230. The phase-shift 220 section is disposed on the gain section 210. The grating section 240 is positioned adjacent to the phase-shift section 220 opposite the gain section 210. The isolation section 230 is disposed between the phase-shift section 220 and the grating section 240. The isolation section 230 impedes the conduction of an electrical current between the gain section 210 and the grating section 240. The method 400 also includes altering 404 a temperature of the grating section of the tunable laser. In some examples, the isolation section 230 defines a trench or comprises an oxide layer.

Altering a temperature of the gain section 210 and the grating section 240 may include delivering a bias current 218 to the grating section 240. The grating section 240 may include a distributed Bragg reflector. The gain section 210 may output the optical signal S from a side $F_{out}$ opposite the phase-shift section 220.

A number of implementations have been described. Nevertheless, it will be understood that various modifications may be made without departing from the spirit and scope of the disclosure. Accordingly, other implementations are within the scope of the following claims.

What is claimed is:

1. A wavelength tunable laser comprising:
    a gain section for generating and modulating an optical signal;
    a grating section positioned adjacent the gain section;
    an isolation section disposed between the gain section and the grating section, the isolation section impeding conduction of an electrical current between the gain section and the grating section;
    a phase-shift section disposed between the gain section and the isolation section, the phase-shift section imparting a phase-shift to the optical signal;
    a thermo-electric cooler disposed on the gain section, the phase-shift section, the grating section, and the isolation section, the thermo-electric cooler configured to regulate a temperature of the gain section to be a lasing temperature within a temperature dependent tunable wavelength range; and
    a controller in communication with the gain section, the phase-shift section, the grating section, and the thermo-electric cooler, the controller configured to deliver:
        a modulation current to the gain section for modulating the optical signal;
        a grating bias current to the grating section for setting a wavelength of the optical signal; and
        a bias current to the thermo-electric cooler to control the temperature of the tunable laser,
        wherein the controller is configured to increase the grating bias current when the gain section and the grating section crosstalk.

2. The wavelength tunable laser of claim 1, wherein the isolation section defines a trench.

3. The wavelength tunable laser of claim 1, wherein the isolation section comprises an oxide layer.

4. The wavelength tunable laser of claim 1, wherein the gain section outputs the optical signal from a gain section facet on a side opposite the phase-shift section.

5. The wavelength tunable laser of claim 1, wherein the grating section comprises a distributed Bragg reflector.

6. A method comprising:
    receiving a modulation current at a gain section of a tunable laser for generating and modulating an optical signal;
    receiving a grating bias current at a grating section to set a lasing mode of the tunable laser; and
    impeding conduction of an electrical current between the grating section and a phase shift section disposed between the grating section and the gain section by increasing the grating bias current when the gain section and the grating section crosstalk.

7. The method of claim 6, wherein a trench is defined between the phase-shift section and the grating section.

8. The method of claim 6, further comprising outputting an optical signal from a gain section facet on a side opposite the phase-shift section.

9. The method of claim 6, wherein the grating section has an optical path length greater than the length of the phase-shift section.

10. The method of claim 6, wherein the grating section comprises a distributed Bragg reflector.

11. A method of tuning a tunable laser comprising:
    altering a temperature of a gain section of the tunable laser, the tunable laser comprising:
        a phase-shift section disposed on the gain section;
        a grating section positioned adjacent the phase-shift section opposite the gain section; and
        an isolation section disposed between the phase-shift section and the grating section, the isolation section impeding conduction of an electrical current between the gain section and the grating section; and
    altering a temperature of the grating section of the tunable laser when the gain section and the grating section crosstalk.

12. The method of claim 11, wherein the isolation section defines a trench.

13. The method of claim 11, wherein the isolation section comprises an oxide layer.

14. The method of claim 13, wherein altering a temperature of the grating section comprises delivering a bias current to the grating section.

15. The method of claim 11, wherein altering a temperature of the gain section or the grating section comprises delivering an electrical current to a thermo-electric cooler disposed on the gain section, the phase-shift section, and the isolation section.

16. The method of claim 11, wherein the gain section outputs the optical signal from a side opposite the phase-shift section.

17. The method of claim 11, wherein the grating section comprises a distributed Bragg reflector.

* * * * *